(12) United States Patent
Rutledge et al.

(10) Patent No.: US 7,411,417 B1
(45) Date of Patent: Aug. 12, 2008

(54) SELECTIVE LOADING OF CONFIGURATION DATA INTO CONFIGURATION MEMORY CELLS

(75) Inventors: David L. Rutledge, Hillsboro, OR (US); Wei Han, Beaverton, OR (US); Yoshita Yerramilli, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 141 days.

(21) Appl. No.: 11/442,186

(22) Filed: May 26, 2006

(51) Int. Cl.
*H03K 19/173* (2006.01)
(52) U.S. Cl. .......................................... 326/38; 326/40
(58) Field of Classification Search .............. 326/37–40
See application file for complete search history.

(56) References Cited

U.S. PATENT DOCUMENTS 7,190,190 B1 * 3/2007 Camarota et al. ............. 326/38
7,215,139 B2 * 5/2007 Agrawal et al. ............... 326/38
2006/0050567 A1 * 3/2006 Shimanek et al. ...... 365/185.28

* cited by examiner

*Primary Examiner*—James H Cho
(74) *Attorney, Agent, or Firm*—MacPherson Kwok Chen & Heid LLP; Brent A. Folsom

(57) ABSTRACT

Systems and methods are disclosed herein to provide improved techniques for loading of configuration memory cells in integrated circuits, such as programmable logic devices. For example, in accordance with an embodiment of the present invention, a programmable logic device includes a non-volatile memory adapted to store a first bit, a second bit, and a plurality of configuration data; a plurality of configuration memory cells; and control logic adapted to determine based on values of the first and second bits whether to load the configuration data from the non-volatile memory into the configuration memory cells.

23 Claims, 4 Drawing Sheets

SELECTIVE LOADING OF CONFIGURATION DATA INTO CONFIGURATION MEMORY CELLS

TECHNICAL FIELD

The present invention relates generally to electrical circuits and, more particularly, to the configuring of programmable logic devices.

BACKGROUND

Various programmable logic devices (PLDs), such as field programmable gate arrays (FPGAs) or complex programmable logic devices (CPLDs), include configuration memory that may be loaded with configuration data for specific applications. In certain PLDs, the configuration memory may be volatile in nature. As such, the configuration data may be loaded into the configuration memory from another non-volatile memory, such as a flash memory, in response to appropriate instructions or when the PLD is powered up.

It is desirable that the configuration data loaded into the configuration memory corresponds to a valid data pattern that facilitates meaningful operation of the PLD. If invalid configuration data is accidentally loaded into the configuration memory, contention errors may cause the PLD to operate improperly or suffer damage.

One approach to determining the validity of configuration data involves the use of a single validation bit in the non-volatile memory. In this approach, as part of an erase process, all bits of the non-volatile memory may be pre-programmed with a particular logic state corresponding, for example, to a logical high state. The non-volatile memory is then erased (corresponding, for example, to a logical low state) and additional conventional operations associated with the erasure of non-volatile memories may be performed. Subsequently, the non-volatile memory is loaded with configuration data. Following the loading, the validation bit may be programmed to a logical high state again to indicate a successful loading of the configuration data.

Unfortunately, if a power failure occurs during the pre-programming operation, the validation bit may be erroneously left at the logical high state which falsely indicates that a valid configuration data pattern has been loaded into the non-volatile memory. As a result, an invalid configuration data pattern may be inadvertently loaded into the volatile configuration memory of the PLD when power is restored.

In certain applications, users may wish to ensure that valid configuration data is provided in non-volatile memory of the PLD, but may also wish to control whether the configuration data is loaded into configuration memory when the PLD is powered up. Unfortunately, where a single validation bit is used as in the prior approach identified above, configuration data may be automatically loaded into configuration memory whenever the PLD is powered on and the validation bit has been programmed to a logical high state. As a result, users may be unable to prevent the loading of configuration data into configuration memory when desired for particular applications.

Accordingly, there is a need for an improved approach to the loading of configuration data that reduces the risk of inadvertent loading of invalid or corrupted configuration data into configuration memory, and that provides users with additional control over the loading.

SUMMARY

In accordance with one embodiment of the present invention, a programmable logic device includes a non-volatile memory adapted to store a first bit, a second bit, and a plurality of configuration data; a plurality of configuration memory cells; and control logic adapted to determine based on values of the first and second bits whether to load the configuration data from the non-volatile memory into the configuration memory cells.

In accordance with another embodiment of the present invention, a method of controlling a programmable logic device includes pre-programming a first bit and a second bit of a non-volatile memory with a first logic state, wherein the non-volatile memory is adapted to store the first bit, the second bit, and a plurality of configuration data; erasing the non-volatile memory, wherein the first bit and the second bit each exhibit a second logic state following the erasing; loading the configuration data into the non-volatile memory; programming the first bit with the first logic state to identify that the loading is completed; and selectively programming a second bit with the first logic state to identify whether a user desires that the configuration data be loaded into a plurality of configuration memory cells.

In accordance with another embodiment of the present invention, a method of controlling a programmable logic device includes reading a first bit and a second bit of a non-volatile memory, wherein the non-volatile memory is adapted to store the first bit, the second bit, and a plurality of configuration data; and selectively loading the configuration data from the non-volatile memory into a plurality of configuration memory cells based on logic states of the first and second bits.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits and applications. As an exemplary implementation, a programmable logic device (PLD) will be utilized to illustrate the techniques in accordance with one or more embodiments of the present invention. However, it should be understood that this is not limiting and that the techniques disclosed herein may be implemented as desired, in accordance with one or more embodiments of the present invention, within various types of circuits.

Figure 1:
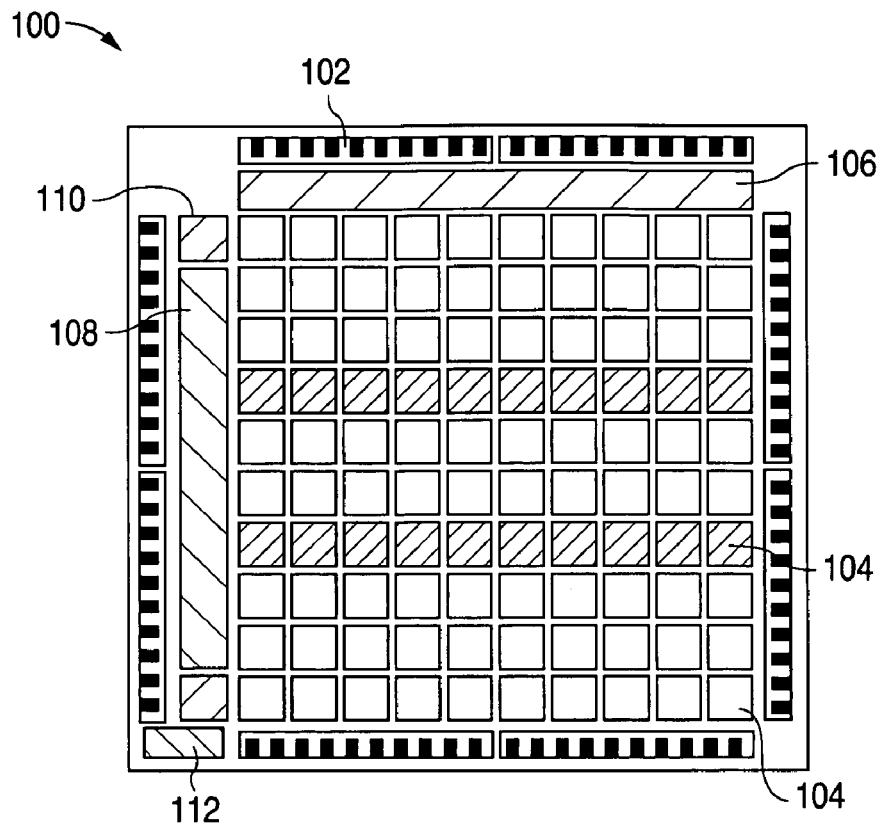
FIG. 1 illustrates a block diagram of an exemplary programmable logic device (PLD) in accordance with an embodiment of the present invention.

FIG. 1 illustrates a block diagram of an exemplary PLD 100 in accordance with an embodiment of the present invention. PLD 100 includes input/output (I/O) blocks 102 and programmable logic blocks 104 (also referred to in the art as configurable logic blocks or array logic blocks), which are used to provide I/O functionality (e.g., one or more I/O and/or memory interface standards) and logic functionality (e.g., LUT-based logic), respectively, for PLD 100. PLD 100 may also include non-volatile memory 106, volatile memory 108 (e.g., block SRAM), and clock-related circuitry 110 (e.g., PLL circuits). It will be appreciated that non-volatile memory 106 may be implemented as flash memory or other types of non-volatile memory that may be reprogrammed once or repeatedly.

PLD 100 also includes one or more data ports 112 which may be used for programming non-volatile memory 106 of PLD 100. For example, data port 112 may represent a programming port such as a joint test action group (JTAG) port employing standards such as Institute of Electrical and Electronics Engineers (IEEE) 1149.1 or 1532 standards. In another embodiment, data port 112 may be implemented as a serial peripheral interface (SPI) port, a central processing unit (CPU) port, or a sysCONFIG programming port.

Non-volatile memory 106 may be used to store configuration data within PLD 100 for transfer to configuration memory of PLD 100 upon power up or during reconfiguration of PLD 100. Non-volatile memory 106 may also store a validation bit and a stop bit, as further described herein.

Figure 2:
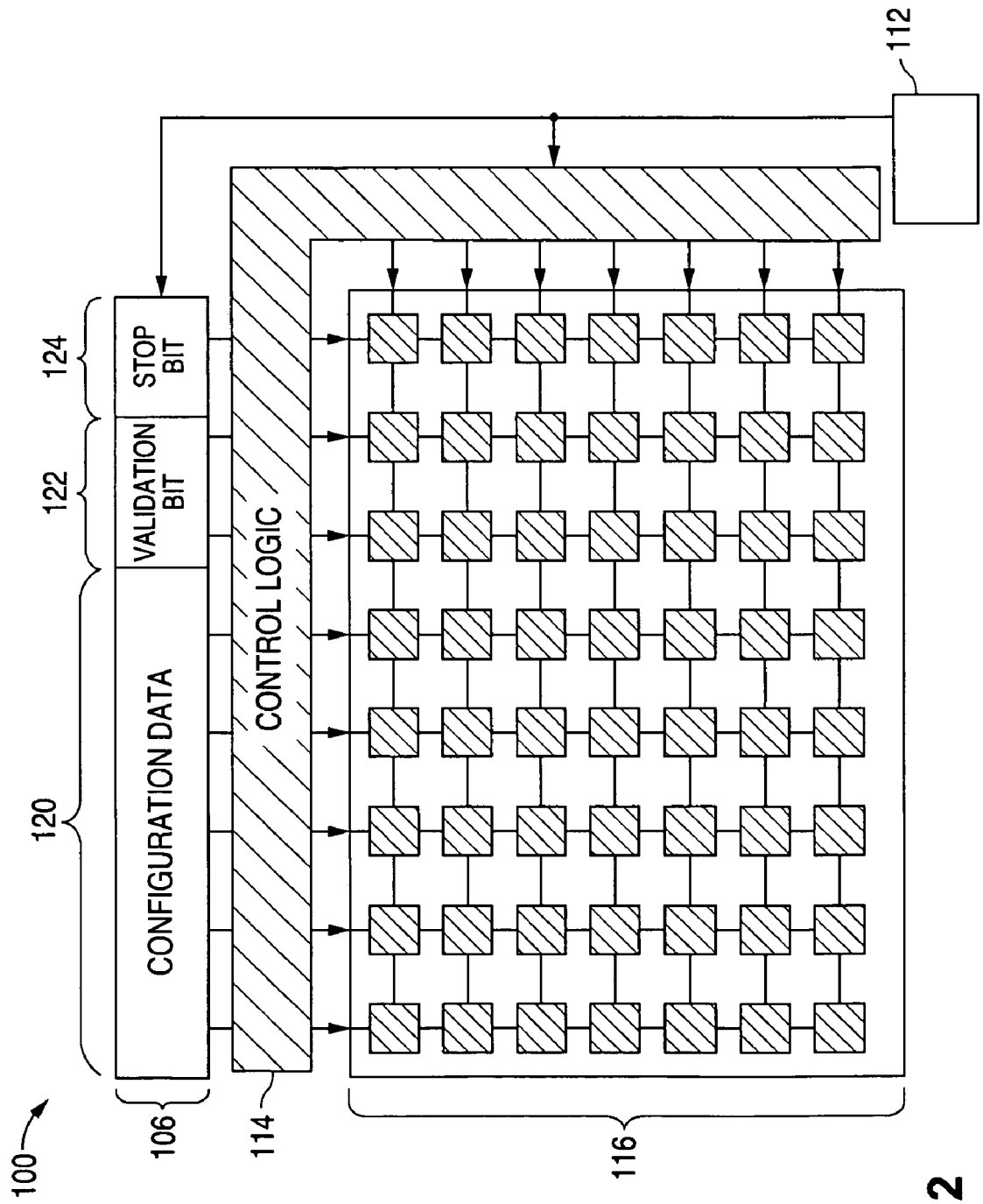
FIG. 2 illustrates a block diagram providing additional implementation details of the PLD of FIG. 1 in accordance with an embodiment of the present invention.

FIG. 2 illustrates a block diagram providing additional implementation details of PLD 100 of FIG. 1 in accordance with an embodiment of the present invention. Specifically, FIG. 2 shows non-volatile memory 106, data port 112, control logic 114, and a plurality of configuration memory cells 116 of PLD 100.

As illustrated, non-volatile memory 106 includes a plurality of configuration data 120, a validation bit 122, and a stop bit 124. Configuration data 120 determines the user-defined functions of PLD 100 (e.g., determines programmable functions of I/O blocks 102 and logic blocks 104). Validation bit 122 (also referred to as a "DONE" bit) stores a programmable data value (i.e., a logical low state or a logical high state) which may be set to indicate whether configuration data 120 has been successfully loaded into non-volatile memory 120 (for example, from an external source through data port 112). Stop bit 124 (also referred to as a "REFRESH_N" bit) stores a programmable data value which may be set by a user of PLD 100 in order to permit selective loading of configuration data 120 from non-volatile memory 106 to configuration memory cells 116. In one embodiment, validation bit 122 and stop bit 124 may be located adjacent to each other and/or in close proximity to each other within non-volatile memory 106.

Configuration memory cells 116 may be volatile SRAM cells or other types of memory such as fuses or anti-fuses. Configuration memory cells 116 are used to store configuration data 120 which may be loaded into configuration memory cells 116 from non-volatile memory 106. The device functionality of PLD 100 may be determined by the configuration data 120 stored in configuration memory cells 116.

Control logic 114 controls the transfer of configuration data 120 from non-volatile memory 106 to configuration memory cells 116. As further described herein, the loading of configuration data 120 from non-volatile memory 106 to configuration memory cells 116 can be managed by control logic 114 in accordance with the data values of validation bit 122 and stop bit 124. For example, in one embodiment, configuration data 120 can be prevented from being loaded into configuration memory cells 116 unless validation bit 122 and stop bit 124 exhibit particular data values.

Figure 3:
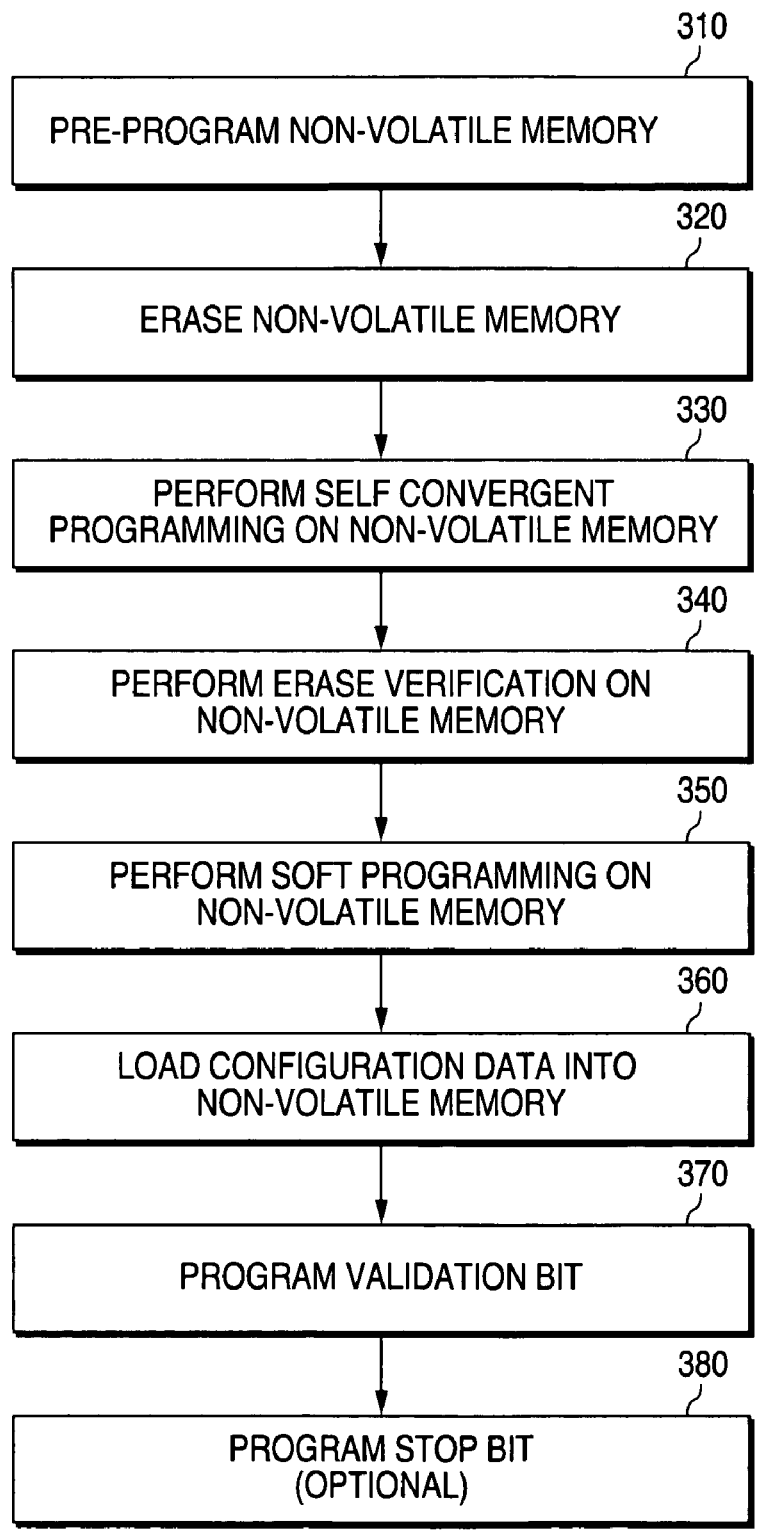
FIG. 3 illustrates a process of programming a non-volatile memory of the PLD of FIG. 1 in accordance with an embodiment of the present invention.

FIG. 3 illustrates a process of programming non-volatile memory 106 of PLD 100 in accordance with an embodiment of the present invention. It will be appreciated that one or more of the operations illustrated in FIG. 3 may be controlled by one or more instructions received by PLD 100 from appropriate software or hardware in communication with PLD 100 through data port 112, as would be understood by one skilled in the art.

At operation 310, memory cells (for example, flash memory cells) of non-volatile memory 106 of PLD 100 are pre-programmed. In this regard, it will be appreciated that prior to operation 310, the contents (i.e., the stored logic states) of non-volatile memory 106 may be unknown or may correspond to an undesirable configuration data pattern. As a result, the entire non-volatile memory 106 including the memory cells associated with configuration data 120, validation bit 122, and stop bit 124, are all programmed in operation 310 with a common data value. For example, in one embodiment, the non-volatile memory cells may be programmed in operation 310 with a logical high state.

At operation 320, non-volatile memory 106 is erased. For example, in one embodiment, operation 320 may be implemented as a bulk erase operation which causes all memory cells of non-volatile memory 106 to be set to an erased state, such as a logical low state.

As illustrated, the process of FIG. 3 further includes self-convergent programming operation 330, erase verification operation 340, and soft programming operation 350 which are various conventional operations associated with the erasure of non-volatile memories. For example, as is known in the art, operations 330 and 350 may include the checking of non-volatile memory cells for over-erasures. As also known in the art, operation 340 may include the checking of non-volatile memory cells to confirm that they correspond to logical low states. Accordingly, it will be appreciated that following operation 350, all non-volatile memory cells of non-volatile memory 106 may exhibit a logical low state.

At operation 360, configuration data 120 is loaded into non-volatile memory 106 through data port 112. Meanwhile, also during operation 360, validation bit 122 and stop bit 124 will continue to exhibit logical low states.

Following operation 360, validation bit 122 is programmed with a logical high state (operation 370) which indicates that configuration data 120 has been successfully loaded into non-volatile memory 106 during previous operation 360. In one embodiment, operation 370 may be performed in response to an instruction received by PLD 100 through data port 112. It will be appreciated that validation bit 122 and stop bit 124 will exhibit logical high and logical low states, respectively, following operation 370.

At optional operation 380, stop bit 124 may be programmed with a logical high state. In this regard, stop bit 124 may be selectively programmed to determine the loading behavior of PLD 100 when powered up. For example, if stop bit 124 is programmed with a logical high state, control logic 114 may be configured to refrain from downloading configuration data 120 from non-volatile memory 106 to configuration memory cells 116 when PLD 100 is powered up.

In view of the foregoing, it will be appreciated that if the process of FIG. 3 is interrupted, configuration data 120 residing in non-volatile memory 106 may be corrupted. For example, if erase operation 320 is interrupted, configuration data 120 may be partially erased (as a result of the partial performance of operation 320) and partially pre-programmed (as a result of the performance of previous operation 310). In another example, if loading operation 360 is interrupted, configuration data 120 may be partially loaded (as a result of the partial performance of operation 360) and partially erased (as a result of the performance of operation 320). In both examples, a subsequent loading of the corrupted configuration data 120 into configuration memory cells 116 could potentially cause PLD 100 to malfunction or even sustain damage.

Accordingly, control logic 114 can be implemented to selectively load configuration data 120 from non-volatile memory 106 into configuration memory cells 116 when PLD 100 is powered up. In particular, control logic 114 can be implemented to prevent the loading of configuration data 120 into configuration memory cells 116 if a logic operation performed on validation bit 122 and stop bit 124 yields a specific result. For example, in one embodiment, such loading can be prevented if validation bit 122 and stop bit 124 correspond to other than logical high and logical low states, respectively.

In the process of FIG. 3 described above, it will be appreciated that the final logic states of validation bit 122 and stop bit 124 are not determined until the completion of operations 370 and 380. As previously discussed, validation bit 122 and stop bit 124 may be located adjacent to each other and/or in close proximity to each other within non-volatile memory 106. Given the potentially large numbers (i.e., thousands or millions) of additional bits stored by non-volatile memory 106 as configuration data 120, it is extremely unlikely that validation bit 122 and stop bit 124 would correspond to opposite logic states such as a logical high state and a logical low state, respectively, at a particular time when any of operations 320 through 360 are interrupted.

For example, if the process of FIG. 3 is interrupted during erase operation 320, validation bit 122 and stop bit 124 will be at logical high and logical low states, respectively, only if the interruption occurs while stop bit 124 is erased and while validation bit 122 is unerased. If validation bit 122 and stop bit 124 are physically adjacent to each other within non-volatile memory 106 then, as discussed above, such an occurrence is unlikely. Moreover, if PLD 100 is further implemented such that validation bit 122 is always erased prior to stop bit 124, such an occurrence is also unlikely.

As another example, if the process of FIG. 3 is interrupted during loading operation 360, validation bit 122 and stop bit 124 may both exhibit logical low states as a result of the previous performance of erase operation 360. The loading of configuration data 120 upon powering up PLD 100 can be prevented in response to a logic operation performed on validation bit 122 and stop bit 124 as further discussed below with regard to FIGS. 4 and 5.

Figure 4:
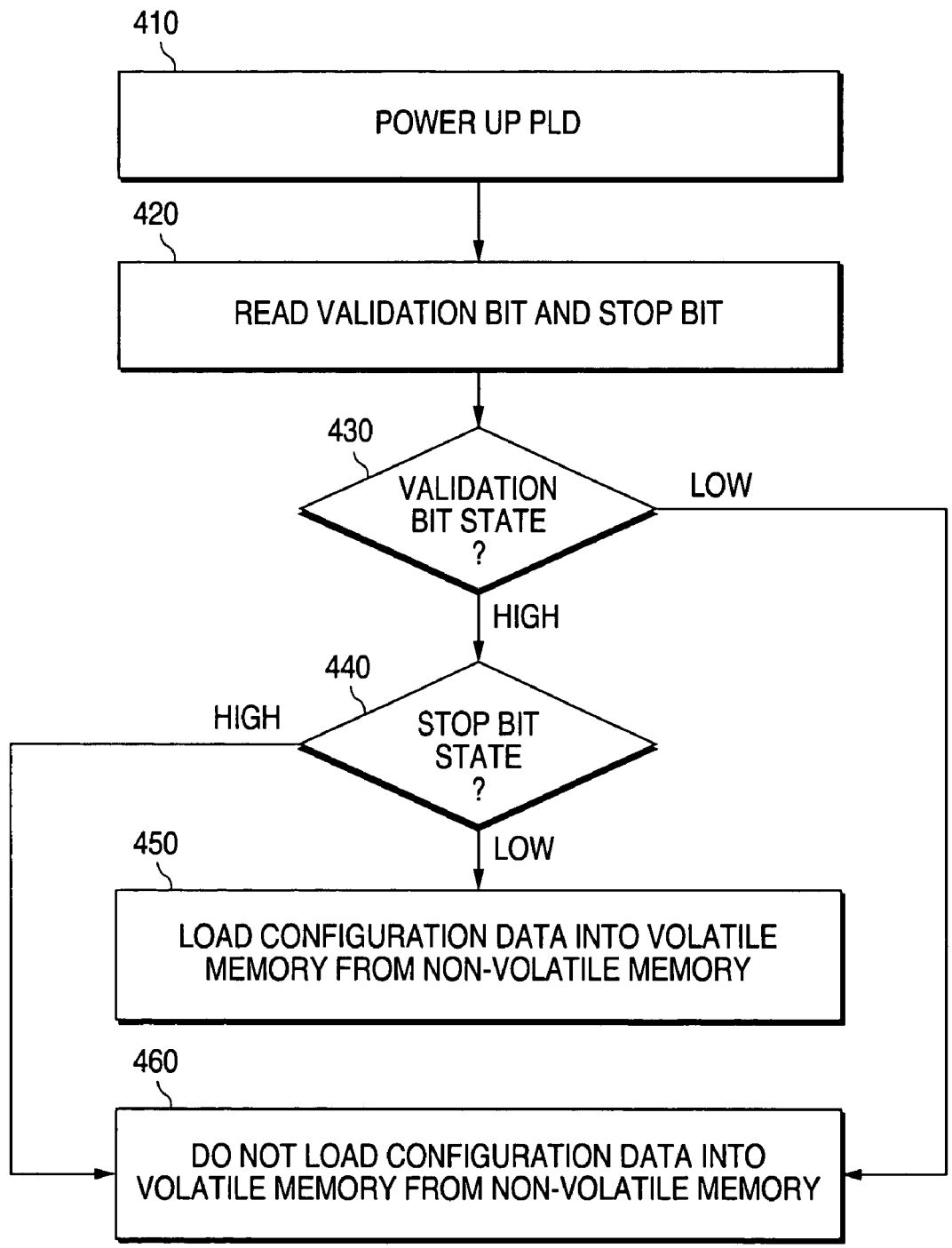
FIG. 4 illustrates a process of selectively loading configuration data from non-volatile memory to configuration memory cells of the PLD of FIG. 1 in accordance with an embodiment of the present invention.

FIG. 4 illustrates a process of selectively loading configuration data 120 from non-volatile memory 106 to configuration memory cells 116 of PLD 100 in accordance with an embodiment of the present invention. It will be appreciated that prior to the performance of the process of FIG. 4, PLD 100 may be in an unpowered state. For example, in one embodiment, PLD 100 may be powered down during or following the process of FIG. 3 (i.e., during or following the programming of non-volatile memory 106).

It will be appreciated that, due to the volatile nature of configuration memory cells 116, any configuration data 120 previously loaded into and stored by configuration memory cells 116 may not be available in configuration memory cells 116 after PLD 100 is powered down. As a result, configuration data 120 can be loaded into configuration memory cells 116 to configure PLD 100. However, in order to prevent inadvertent loading of configuration data 120 from non-volatile memory 106 into configuration memory cells 116, such loading can be conditioned on the logic states stored by validation bit 122 and stop bit 124.

Turning now to the particular operations identified in FIG. 4, at operation 410, PLD 100 is powered up. In another embodiment, operation 410 may correspond instead to PLD 100 exiting an edit mode (e.g., which may also be referred to as an "isc_accessed state" in some embodiments). At operation 420, validation bit 122 and stop bit 124 are read by control logic 114.

Control logic 114 then performs a logic operation on validation bit 122 and stop bit 124 to determine whether to load configuration data 120 into configuration memory cells 116. This logic operation is represented conceptually in FIG. 4 by decision points (i.e., operations) 430 and 440.

For example, if validation bit 122 has been set to a logical low state (operation 430), then the process of FIG. 4 proceeds to operation 460 in which configuration data 120 is not loaded into configuration memory cells 116. However, if validation bit 122 has been set to a logical high state (i.e., previously set in operation 370 of FIG. 3), then the process proceeds to operation 440.

If stop bit 124 has been set to a logical high state (operation 440), then configuration data 120 is not loaded into configuration memory cells 116 (operation 460). However, if stop bit 124 has been set to a logical low state, then the process of FIG. 4 proceeds to operation 450 in which configuration data 120 is loaded into configuration memory cells 116 from non-volatile memory 106. Regardless of the logic states of validation bit 122 and stop bit 124, configuration data 120 may be optionally loaded into configuration memory cells 116 at a later time in response to a command (e.g., a user-initiated refresh instruction) received by PLD 100 through data port 112.

Figure 5:
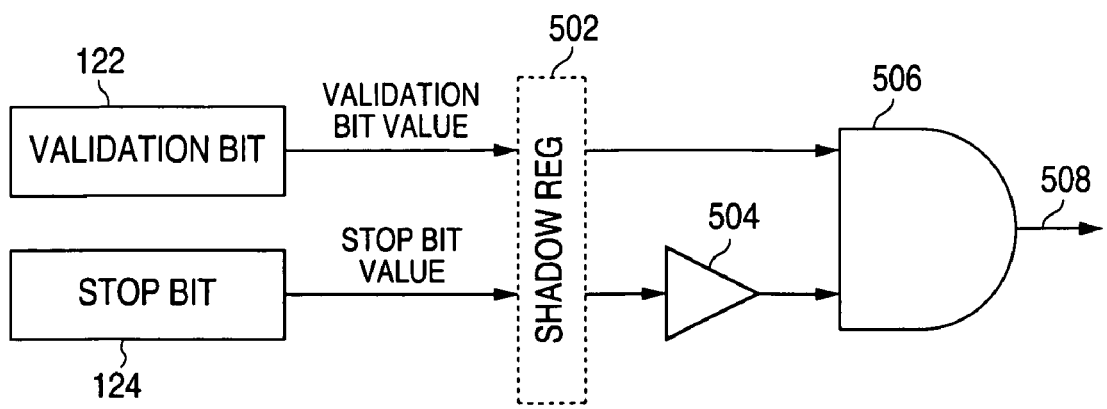
FIG. 5 illustrates a logic operation performed by the PLD of FIG. 1 on a validation bit and a stop bit in accordance with an embodiment of the present invention.

The performance of read operation 420 and the logic operation conceptually represented by operations 430 and 440 of FIG. 4 can be further understood with reference to FIG. 5. In particular, FIG. 5 shows the data values of validation bit 122 and stop bit 124 being provided to a register 502 (labeled "SHADOW REG") and various logic components including an inverter 504 and an AND gate 506, all of which may be implemented by control logic 114 of PLD 100. It will be appreciated that validation bit 122 and stop bit 124 as illustrated in FIG. 5 may have been programmed in response to instructions previously provided in operations 370 and 380, respectively, of FIG. 3.

Control logic 114 may read the data values of validation bit 122 and stop bit 124 (operation 420) by loading their respective data values into register 502. In another embodiment, register 502 may be replaced by a plurality of sense amplifiers adapted to read (i.e., detect) the data values of validation bit 122 and stop bit 124. The data values are passed to the combinatorial logic of inverter 504 and AND gate 506 which provide an output value 508 (i.e., a logic result) as illustrated.

Upon inspection of FIG. 5, it will be appreciated that output value 508 will correspond to a logical high state (i.e., a "1" value) if validation bit 122 corresponds to a logical high state while stop bit 124 corresponds to a logical low state. Output value 508 will correspond to a logical low state (i.e., a "0" value) for all other combinations of validation bit 122 and stop bit 124.

Considering the logic operation of FIG. 5 in the context of operations 420 through 460 of FIG. 4, it will be appreciated that if output value 508 corresponds to a logical high state (i.e., validation bit 122 and stop bit 124 correspond to logical high and logical low states, respectively), then the process of FIG. 4 proceeds through to operation 450 where control logic 114 loads configuration data 120 into configuration memory cells 116 from non-volatile memory 106. However, if output value 508 corresponds to a logical low state (i.e., validation bit 122 corresponds to a logical low state and/or stop bit 124 corresponds to a logical high state), then the process of FIG. 4 proceeds through to operation 460, where control logic 114 does not load configuration data 120 into configuration memory cells 116.

In view of the present disclosure, it will be appreciated that an approach to the loading of configuration data in accordance with the various embodiments set forth herein can reduce the likelihood of inadvertently loading invalid or corrupted configuration data into configuration memory cells of a PLD. It will be further appreciated that such an approach can additionally provide users with flexibility in choosing whether to permit otherwise valid configuration data to be loaded into configuration memory cells.

Embodiments described above illustrate but do not limit the invention. For example, although various features have been described with reference to particular logic states, it will be appreciated that implementations utilizing different logic states are also contemplated by the present disclosure. It should also be understood that numerous modifications and variations are possible in accordance with the principles of the present invention. Accordingly, the scope of the invention is defined only by the claims.

We claim:

1. A programmable logic device comprising:
a non-volatile memory adapted to store a first bit, a second bit, and a plurality of configuration data;
a plurality of configuration memory cells; and
control logic adapted to determine based on values of the first and second bits whether to load the configuration data from the non-volatile memory into the configuration memory cells, wherein the first bit is adapted to be programmed in response to a loading of the configuration data into the non-volatile memory.

2. The programmable logic device of claim 1, wherein the second bit is adapted to be programmed to prevent a loading of the configuration data from the non-volatile memory into the configuration memory cells.

3. The programmable logic device of claim 1, wherein the first bit is adjacent to the second bit in the non-volatile memory.

4. The programmable logic device of claim 1, further comprising a data port adapted to receive instructions to program the first and second bits.

5. The programmable logic device of claim 1, wherein the control logic comprises a register adapted to receive the first bit and the second bit from the non-volatile memory.

6. The programmable logic device of claim 1, further comprising a plurality of sense amplifiers adapted to provide the first bit and the second bit to the control logic.

7. The programmable logic device of claim 1, wherein the configuration memory cells are volatile SRAM memory cells.

8. The programmable logic device of claim 1, wherein the non-volatile memory is a flash memory.

9. A method of controlling a programmable logic device, the method comprising:
pre-programming a first bit and a second bit of a non-volatile memory with a first logic state, wherein the non-volatile memory is adapted to store the first bit, the second bit, and a plurality of configuration data;
erasing the non-volatile memory, wherein the first bit and the second bit each exhibit a second logic state following the erasing;
loading the configuration data into the non-volatile memory;
programming the first bit with the first logic state to identify that the loading is completed; and
selectively programming a second bit with the first logic state to identify whether a user desires that the configuration data be loaded into a plurality of configuration memory cells.

10. The method of claim 9, further comprising:
performing a logic operation on the first bit and the second bit to obtain a logic result; and
selectively loading the configuration data from the non-volatile memory into a plurality of configuration memory cells in response to the logic result.

11. The method of claim 9, wherein the method is performed in response to instructions received by the programmable logic device.

12. The method of claim 9, wherein the configuration memory cells are volatile SRAM memory cells.

13. The method of claim 9, wherein the non-volatile memory is a flash memory.

14. The method of claim 9, further comprising:
reading the first bit and the second bit; and
selectively loading the configuration data from the non-volatile memory into the plurality of configuration memory cells based on logic states of the first and second bits.

15. The method of claim 14, wherein the selectively loading comprises performing a logic operation on the first bit and the second bit to obtain a logic result.

16. The method of claim 14, wherein the reading and selectively loading are performed by control logic of the programmable logic device.

17. The method of claim 14, wherein the reading and selectively loading are performed in response to a powering up of the programmable logic device.

18. The method of claim 14, wherein the reading comprises loading the first bit and the second bit into a register.

19. The method of claim 14, wherein the configuration memory cells are volatile memory cells.

20. The method of claim 14, wherein the first bit is a validation bit and the second bit is a stop bit.

21. The method of claim 14, wherein the configuration data is loaded from the non-volatile memory into the plurality of configuration memory cells based on the first and second bits having opposite logic states.

22. The method of claim 21, wherein the first bit has a logical high state and the second bit has a logical low state.

23. A programmable logic device comprising:
a non-volatile memory adapted to store a first bit, a second bit, and a plurality of configuration data;
a plurality of configuration memory cells; and
control logic adapted to determine based on values of the first and second bits whether to load the configuration data from the non-volatile memory into the configuration memory cells, wherein the second bit is adapted to be programmed to prevent a loading of the configuration data from the non-volatile memory into the configuration memory cells.

* * * * *